(12) United States Patent
Steiner

(10) Patent No.: US 8,779,835 B2
(45) Date of Patent: Jul. 15, 2014

(54) SIGNAL PROCESSING ARRANGEMENT AND SIGNAL PROCESSING METHOD, PARTICULARLY FOR ELECTRONIC CIRCUITS

(75) Inventor: Matthias Steiner, Seiersberg (AT)

(73) Assignee: austriamicrosystems AG (AT)

( * ) Notice: Subject to any disclaimer, the term of this patent is extended or adjusted under 35 U.S.C. 154(b) by 9 days.

(21) Appl. No.: 13/461,200

(22) Filed: May 1, 2012

(65) Prior Publication Data

US 2012/0280743 A1  Nov. 8, 2012

(30) Foreign Application Priority Data

May 6, 2011 (DE) .......................... 10 2011 100 742

(51) Int. Cl.
  *G06F 7/42* (2006.01)
(52) U.S. Cl.
  USPC .......................................... 327/361; 327/133
(58) Field of Classification Search
  USPC ................................................. 327/133, 361
  See application file for complete search history.

(56) References Cited

U.S. PATENT DOCUMENTS

| 3,807,816 | A | 4/1974 | Hamburg | |
|---|---|---|---|---|
| 6,255,908 | B1 * | 7/2001 | Ghannouchi et al. | 330/149 |
| 2003/0132800 | A1 * | 7/2003 | Kenington | 330/124 R |
| 2005/0093582 | A1 | 5/2005 | Bock | |
| 2008/0111622 | A1 * | 5/2008 | Sperlich et al. | 330/124 R |
| 2008/0238544 | A1 * | 10/2008 | Morris et al. | 330/149 |
| 2008/0310654 | A1 | 12/2008 | Jambor et al. | |
| 2009/0196630 | A1 * | 8/2009 | Ishaug et al. | 398/193 |
| 2010/0022211 | A1 | 1/2010 | Huang | |
| 2011/0076974 | A1 * | 3/2011 | Jang | 455/188.1 |
| 2011/0298522 | A1 * | 12/2011 | Ichikawa | 327/361 |

FOREIGN PATENT DOCUMENTS

DE  103 50 628 A1   6/2005
DE  10 2008 023 919   11/2008

OTHER PUBLICATIONS

Weisstein, Eric W. "Linear Combination." From MathWorld—A Wolfram Web Resource. http://mathworld.wolfram.com/LinearCombination.html, Date Accessed Jan. 31, 2014.*
Roach, Steve, "7. Signal Conditioning in Oscilloscopes and the Spirit of Invention," pp. 65-84 http://khach2.narod.ru/Book/Signal_Conditioning_in_Oscillioscopes.pdf.
"Bi-Amping," http://en.wikipedia.org/wiki/Bi-amping.
"High Dynamic-Range Imaging," http://en.wikipedia.org/wiki/High_dynamic_range_imaging.

* cited by examiner

*Primary Examiner* — Thomas J Hiltunen
(74) *Attorney, Agent, or Firm* — DLA Piper LLP (US)

(57) ABSTRACT

A signal processing arrangement including a signal processing stage that divides an input signal (Vin) applied to a signal input (In) of the signal processing stage into at least two subsignals (Vin_a, Vin_b) as a function of a signal amplitude (A) of the input signal (Vin), wherein the signal processing stage is designed for parallel signal processing of the subsignals (Vin_a, Vin_b), and a reconstruction stage connected to the signal processing stage and provides an output signal (Vout) by weighting and combining the at least two processed subsignals (Vin_a, Vin_b).

16 Claims, 3 Drawing Sheets

PRIOR ART

SIGNAL PROCESSING ARRANGEMENT AND SIGNAL PROCESSING METHOD, PARTICULARLY FOR ELECTRONIC CIRCUITS

RELATED APPLICATIONS

This application claims priority to German Application No. 10 2011 100 742.7, filed May 6, 2011, the subject matter of which is incorporated by reference.

TECHNICAL FIELD

This disclosure pertains to a signal processing arrangement and a signal processing method, particularly for electronic circuits.

BACKGROUND

Signal processing generally has the purpose of extracting information from a given signal by analysis and processing. Although a variety of signal types need to be processed, they have one thing in common, namely that they are subject to noise due to different phenomena. It is generally advantageous to control the signal processing such that the highest dynamic range possible or a high signal-to-noise ratio can be achieved. In this context, the dynamic range DR is respectively defined as the ratio between the maximal signal Smax and the noise component N or $$DR = \frac{S_{max}}{N}.$$

FIG. 6 shows an exemplary signal processing path with several stages ST1, ST2 that respectively may represent elements such as amplifiers, buffers, analog-digital converters and the like, or comprise one or more of these elements. Signal processing by the stages ST1, ST2 usually takes place serially and in series, respectively.

Noise Nst1, Nst2 is respectively impressed on the signal Sin to be processed or the intermediate signals derived thereof by each of the individual stages ST1, ST2. An original input signal Sin is thus converted into an output signal Sout, on which an overall noise Nout is superimposed:

$$S_{in} \rightarrow S_{out} + N_{out}.$$

A simple observation in this model shows that further noise is added into the signal processing with each additional processing stage. To this end, respective noise sources Nst1, Nst2 that are added to the signal Sin in each processing stage ST1, ST2 are shown in FIG. 6. In that model, each of the processing stages ST1, ST2 is furthermore represented by a characteristic amplification factor A1, A2. The output signal Sout then results from the signal Sin as a function of the amplification factors A1, A2 in the form of $$S_{out} = S_{in} \cdot A_1^2 \cdot A_2^2.$$

On the other hand, the noise is also amplified and, therefore, results in an overall noise Nout $$N_{out} = N_{st1} \cdot A_1^2 \cdot A_2^2 + N_{st2} \cdot A_2^2.$$

To respectively ensure the best signal-to-noise ratio possible or a high dynamic range DR, it is advantageous to increase the signal amplitude with amplification factor A1 as early as possible in the signal processing chain ST1, ST2 because:

$$N_{in} = \frac{N_{out}}{(A_1^2 \cdot A_2^2)} = N_{st1} + \frac{N_{st2}}{A_1^2}.$$

applies to the input noise Nin.

Theoretically, it would therefore be advantageous to already amplify signals to infinite amplitude in the first stage ST1 such that subsequent noise with arbitrary, but finite intensity no longer influences the dynamic range DR.

In practical applications, the signal amplitude naturally cannot be arbitrarily increased and the maximum of a signal depends on the corresponding transmission medium such as a voltage, current or the like. If the signal processing is carried out, for example, by a voltage, the maximal signal is usually limited by the minimal supply voltage of the circuit. The intensity of the minimal supply voltage usually cannot be additionally increased during processing in this case.

It could therefore be helpful to provide a signal processing arrangement and a signal processing method that make it possible to achieve a high dynamic range with simple means.

SUMMARY

I provide a signal processing arrangement including a signal processing stage that divides an input signal (Vin) applied to a signal input (In) of the signal processing stage into at least two subsignals (Vin_a, Vin_b) as a function of a signal amplitude (A) of the input signal (Vin), wherein the signal processing stage is designed for parallel signal processing of the subsignals (Vin_a, Vin_b), and a reconstruction stage connected to the signal processing stage and provides an output signal (Vout) by weighting and combining the at least two processed subsignals (Vin_a, Vin_b).

I also provide a signal processing method for electronic circuits including dividing an input signal (Vin) into at least two subsignals (Vin_a, Vin_b) as a function of a signal amplitude (A) of the, input signal (Vin), parallel signal processing the at least two subsignals (Vin_a, Vin_b) in at least a first and a second signal path (a, b), and providing an output signal (Vout) by weighting and combining the processed subsignals (Vin_a, Vin_b).

DETAILED DESCRIPTION

Figure 1:
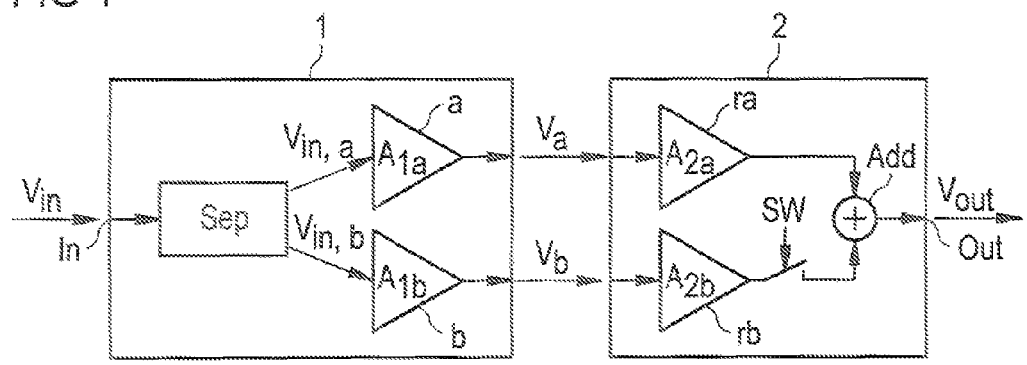
FIG. 1 shows an example of my signal processing arrangement.

It will be appreciated that the following description is intended to refer to specific examples of structure selected for illustration in the drawings and is not intended to define or limit the disclosure, other than in the appended claims.

I provide signal processing arrangements comprising a signal processing stage and a reconstruction stage connected to one another.

When an input signal is applied to a signal input of the signal processing stage, it is divided into at least two subsignals by the signal processing stage. This takes place as a function of the signal amplitude of the input signal. In this way, parallel and simultaneous signal processing of the subsignals is implemented in the signal processing stage. The thus prepared subsignals may be simultaneously or separately subjected to further processing steps. Due to the connection with the reconstruction stage, the at least two subsignals are fed to the reconstruction stage. The reconstruction stage weights and combines the at least two subsignals into an output signal and makes this output signal available at a signal output of the reconstruction stage.

Parallel signal processing along different signal paths is implemented with the aid of the division of the input signal into several, but at least two subsignals. Each of these signal paths may respectively provide controlled processing in dependence on the signal amplitude. Consequently, it is possible to provide one signal path for signals with low amplitudes to realize noise-controlled processing and another signal path for signals with high or maximal amplitudes. In this case, the respective signal paths have different noise characteristics that can be adjusted to the respective signal.

Due to the weighting and combining in the reconstruction stage, it is possible to respectively reconstruct the output signal or the input signal from the at least two subsignals that were respectively processed in a separate and controlled fashion by weighting and combining. Signal distortions can be minimized, in this way. All in all, a high dynamic range can be achieved with the signal processing stage and the reconstruction stage.

However, the division into at least two subsignals only represents one possible variation of the signal processing arrangement. Depending on the respective application, more than two subsignals and corresponding embodiments are also possible. In this way, it is possible to adapt the signal processing to different amplitude ranges. This is particularly advantageous for, but not limited to, audio applications.

In another example, the output signal is described by a linear function of the input signal.

Due to a suitable division into the at least two subsignals and the subsequent weighting and combining in the reconstruction stage, the output signal may describe a linear function of the input signal. In this way, it is ensured within broad ranges that the signal processing has a high dynamic range, but does not lead to any signal distortions.

In another example, the signal processing stage features a separator that comprises the signal input.

The at least two subsignals are generated by the separator in the form of non-linear subfunctions of the signal amplitude of the input signal.

The non-linear subfunctions advantageously make it possible to better adjust the individual signal processing paths in the signal processing arrangement. For example, one non-linear subfunction may be provided for low signal amplitudes and another non-linear subfunction may be provided for high signal amplitudes.

In another example, the signal processing stage comprises at least a first and a second signal path respectively connected to the separator. Adjustable amplification factors are respectively provided for the at least first and second signal paths.

The separator respectively feeds one of the at least two subsignals to the first and the second signal path. Consequently, an amplification can be adjusted in the respective signal paths with the aid of the respective adjustable amplification factors. This amplification preferably takes into account the signal amplitude of the corresponding subsignal.

Controlled signal paths for different signal amplitude ranges can be defined with the aid of the adjustable amplification factors. For example, signal paths for low amplitudes and signal paths for high amplitudes can be separately amplified and controlled with respect to their dynamic range.

In another example, the reconstruction stage comprises at least a first and a second reconstruction path. The first and the second reconstruction paths respectively have adjustable weighting factors.

Weighting of the at least two subsignals is carried out with the aid of the adjustable weighting factors. This weighting is preferably adapted to the adjustable, amplification factors of the signal paths and allows a largely interference-free and, in particular, linear reconstruction of the input signal.

According to another example, the signal processing stage is in the form of a pre-amplifier. This pre-amplifier has at least two amplifier outputs, at which the at least two subsignals are respectively made available. The reconstruction stage furthermore features a digital-analog converter designed for weighting and combining the at least two subsignals in the form of digital subsignals.

In another example, the pre-amplifier comprises an operational amplifier. The operational amplifier has at least two amplifier outputs that are fed back to an inverting input of the operational amplifier by means of resistive elements. A non-inverting input of the operational amplifier is connected to the ground potential.

The input signal can be applied to an inverting input of the operational amplifier by a first resistive element. The resistive elements serve for adjusting the weighting.

In another example, the operational amplifier features a class AB driver stage on its input side. A first transistor stage comprises two transistors that are connected by their load sides and supplied with supply voltages. The respective control sides of the transistors are coupled to the class AB driver stage by a connection node. One of the at least two subsignals is available at an output of the transistor stage. Furthermore, a second transistor stage is provided that features two transistors connected by the load sides and supplied with supply voltages. The respective control sides of these transistors are coupled to the connection node by voltage sources. Another of the at least two subsignals is available at the output of this transistor stage.

The subsignals are initially generated from the input signal by the class AB driver stage AB. Depending on the signal amplitude of the input signal, the first and the second transistor stages are incrementally activated. This is the case, in particular, when the subsignals at the output of the class AB driver stage nearly reach saturation of the supply voltages.

In another example, the signal processing stage or the reconstruction stage features a switch. The switch of the reconstruction stage or of the signal processing stage respectively makes it possible to selectively activate or deactivate a signal path or reconstruction path. This preferably takes place in dependence on a switching signal of a detector.

The noise characteristics of the signal processing arrangement can be additionally improved with the aid of activatable signal paths. Signal paths that are not required, therefore, can be selectively switched off and the power consumption can be reduced accordingly.

In a variation of the signal processing method, particularly for electronic circuits, an input signal is initially divided into at least two subsignals as a function of a signal amplitude of the input signal. Consequently, the at least two subsignals are processed in parallel on at least a first and a second signal path. An output signal is ultimately made available by weighting and combining the processed subsignals.

Division of the input signal into several, but at least two, subsignals allows parallel and separate signal processing along different signal paths. Depending on the signal amplitude, each of the signal paths may provide processing that is controlled with respect to the currently applied signal amplitude. It would, therefore, be conceivable to provide one signal path for signals with low amplitudes to realize noise-optimized processing and another signal path for signals with high or maximal amplitudes. In this case, the respective signal paths have different noise characteristics that can be adjusted to the respective signal.

The weighting and combining furthermore makes it possible to respectively reconstruct the output signal or the input signal from the at least two subsignals that were respectively processed in a separate and controlled fashion. In this way, signal distortions can be minimized. All in all, a high dynamic range can be achieved in this manner.

In another variation of the signal processing method, the weighting and combining of the processed subsignals takes place such that the output signal is a linear function of the input signal. Signal distortions are advantageously low due to this measure.

In another variation, the division of the input signal into the at least two subsignals takes place by non-linear subfunctions of the signal amplitude of the input signal.

Individual signal processing paths advantageously can be better adjusted by the non-linear subfunctions. For example, one non-linear subfunction may be provided for low signal amplitudes and another non-linear subfunction may be provided for high signal amplitudes. In addition, continuous transitions from low to high signal amplitudes without points of discontinuity can be implemented.

In another variation, the weighting takes place by adjustable amplification factors and adjustable weighting factors. In this case, the amplification factors and the adjustable weighting factors are adapted to one another such that the output signal reproduces the input signal with minimal signal noise.

According to another variation, at least the first or the second signal path is switched into the active or inactive state in dependence on the signal amplitude.

The noise characteristic of the signal processing can be further improved with the aid of activatable signal paths. Signal paths that are not required, therefore, can be switched on or off selectively or as a function of the signal amplitude, and the power consumption can be reduced accordingly.

Several examples are described in greater detail below with reference to the figures. The description of circuit components or elements that fulfill corresponding functions is not repeated for each of the following figures.

FIG. 1 shows an example of a signal processing arrangement. The signal processing arrangement comprises a signal processing stage 1 and a reconstruction stage 2 connected to one another. The signal processing stage 1 features a signal input In that is connected to a separator Sep. Separate first and second signal paths a, b that respectively have adjustable amplification factors A1$a$, A1$b$ are coupled to outputs of the separator Sep. The signal paths a, b are connected to inputs of the reconstruction stage 2 and respectively coupled to reconstruction paths ra, rb. The respective reconstruction paths ra, rb have adjustable weighting factors A2$a$, A2$b$. The reconstruction paths ra, rb lead to the input side of an adder Add. On the output side, the adder Add is connected to a signal output Out of the reconstruction stage.

If an input signal Vin is applied to the input of the signal processing stage In, this input signal is split into a first and a second subsignal Vin_a, Vin_b in parallel by the separator Sep and fed into the first and the second signal paths a, b. The first and the second subsignals Vin_a, Vin_b are amplified into amplified subsignals Va, Vb by the adjustable amplification factors A1$a$, A1$b$. The amplified subsignals Va, Vb are then fed into the corresponding reconstruction paths ra, rb. Along these reconstruction paths, they are weighted in accordance with the adjustable weighting factors A2$a$, A2$b$ and then fed to the adder Add, in which they are added. In this way, an output signal Vout is formed and made available at the output of the reconstruction stage 2.

The signal processing by the signal processing arrangement therefore takes place along a path comprising the signal processing stage 1 and a reconstruction stage 2, namely in that the input signal Vin is processed in parallel and simultaneously in the form of subsignals. In this case, the signal paths a, b and the reconstruction paths ra, rb respectively have different and independent amplification factors A1$a$, A1$b$ and weighting factors A2$a$, A2$b$. The respective values depend on the signal amplitude of the input signal Vin. Consequently, the individual paths a, b, ra, rb respectively can be adapted to a high dynamic range or a low noise characteristic. For example, a signal path a, b for high signal amplitudes may have correspondingly low amplification factors while low signal amplitudes can be amplified with high amplification factors.

Individual paths a, b, ra, rb can be selectively activated or deactivated by a switch SW arranged in one of the reconstruction paths rb as illustrated in FIG. 1. This has the advantage that it is possible to select the paths that respectively have the best noise characteristic and can describe the required signal amplitude among the paths a, b, ra, rb in dependence on the signal amplitude of the input signal Vin. Since paths that are not required can be deactivated, the power consumption can be lowered and the noise can be reduced, for example, at low signal amplitudes.

Figure 2A:
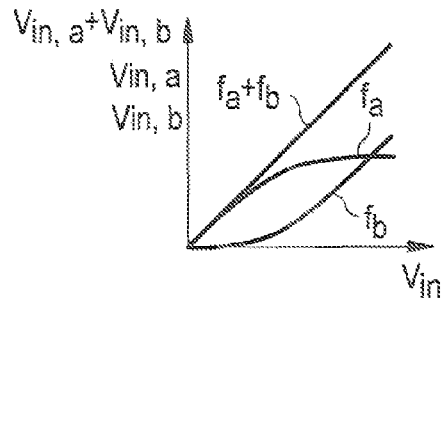
FIG. 2. shows an example of signal processing with the aid of the signal processing stage and the reconstruction stage.

FIG. 2 shows the signal processing according to the proposed principle with the aid of the signal processing stage 1 and the reconstruction stage 2 in greater detail.

FIG. 2($a$) shows the division into subfunctions Vin_a, Vin_b by the separator Sep. The subsignals Vin_a, Vin_b are respectively illustrated as a function of the input signal Vin or its signal amplitude A. The subsignals Vin_a, Vin_b can be described as functions fa, fb of the signal amplitude. In this example, the functions fa, fb are chosen to be non-linear. However, the sum fa+fb results in the input signal Vin for all signal amplitudes and signals Vin such that $$Vin = Vin\_a + Vin\_b$$

applies.

Due to the non-linearity of the subfunctions Vin_a, Vin_b, the functional characteristic of the division into the subsignals Vin_a, Vin_b can be adapted to the occurring signal amplitudes. For example, the function fa already leads to relatively high subsignals Vin_a at low signal amplitudes while the function fb only leads to higher subsignals Vin_b at high amplitudes. An amplitude-dependent division over the signal paths a, b is realized in this way. The division can be controlled within broad ranges by adapting the functions fa, fb to one another.

FIG. 2($b$) shows amplified subsignals Va, Vb that were amplified from the subsignals Vin_a and Vin_b by the amplification factors A1$a$, A1$b$ in accordance with the signal paths a, b. This figure clearly shows that the subsignal Va dominates at low signal amplitudes while the subsignal Vb only becomes significant at higher amplitudes.

Figures 2B, 2C:
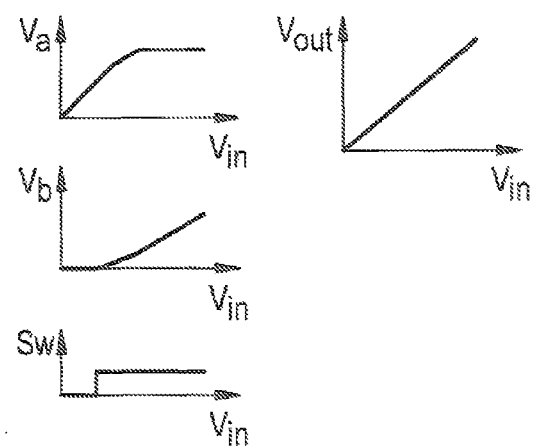

This figure furthermore shows a switching signal SW for respectively switching the switch SW on or off. This also takes place in dependence on the signal amplitude A or the input signal Vin, respectively. For example, the signal path b with all its signal processing blocks is switched off as shown in. FIG. 2(b) for low signal amplitudes of the input signal Vin and, therefore, does not contribute to the power consumption or the noise of the signal processing arrangement.

FIG. 2(c) shows the output signal Vout as a function of the input signal Vin. The signal processing arrangement and the signal processing method, respectively, make it possible to describe the output signal Vout in the form of a linear function of the input signal Vin despite signal processing. A particularly advantageous dynamic range can be achieved in this way.

This is achieved, among other things, in that the amplification factors A1a, A1b and the weighting factors A2a, A2b are respectively adapted to one another such that $$A1a \cdot A2a = A1b \cdot A2b$$

applies.

Although the input signal Vin was divided into non-linear subsignals for parallel signal processing, the output signal Vout can be described as a linear function of the input signal Vin. Due to this measure, signal distortions are low and a high dynamic range DR can be achieved with the noise-controlled signal paths a, b and reconstruction paths ra, rb, respectively.

In this case, switching off individual signal paths or reconstruction paths by switches SW also does not lead to a discontinuous or distorted transfer function Vin→Vout. To this end, it is preferred to provide a threshold value for the concerned channels such that the paths are only deactivated when their contribution to the output signal Vout is respectively lower than the threshold value or is tolerable. The corresponding criteria can be adjusted on the signal processing arrangement.

In this way, the dynamic range of the signal processing arrangement can be additionally improved because the signal paths respectively are dynamically activated and deactivated in dependence on the signal amplitude of the input signal Vin. For example, only signal paths with low noise and high amplification are used for low signal amplitudes. Additional signal paths with low amplification are accordingly activated for high signal amplitudes. In this case, switching interferences can be kept low if the division is carried out on the basis of non-linear functions as described above. The proposed signal processing arrangement is particularly advantageous for audio applications in which loud (high amplitudes) and muted (low amplitudes) alternate. Consequently, a higher noise component usually is also tolerable at high amplitudes. However, the application is not restricted to audio only.

Figure 3:
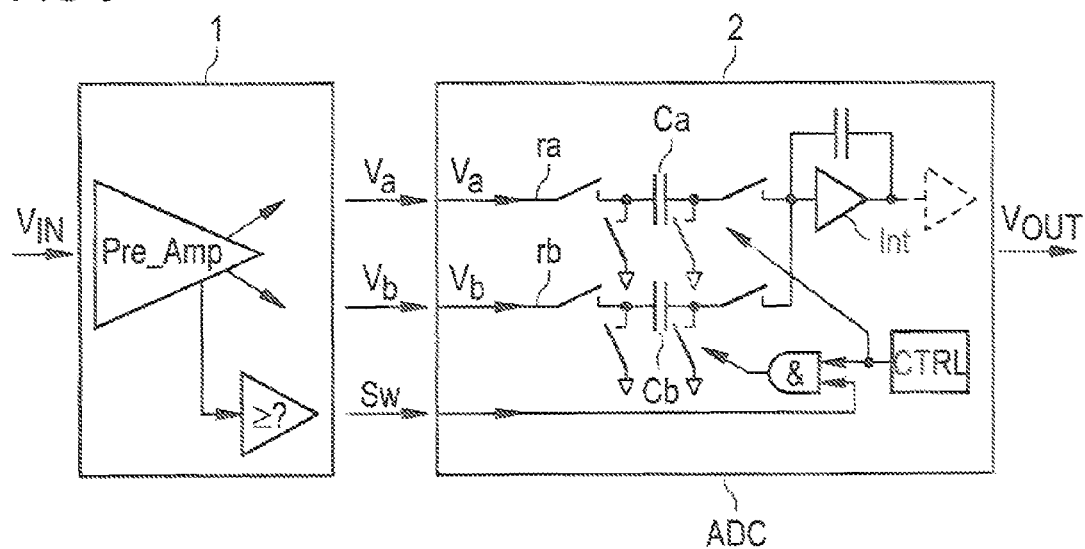
FIG. 3 shows another example of a signal processing arrangement.

FIG. 3 shows another example of the signal processing arrangement. In this example, the signal processing stage 1 is realized in the form of a pre-amplifier Pre_Amp. At least two amplifier outputs of the pre-amplifier Pre_Amp make available the subsignals Va, Vb amplified from the two subsignals Vin_a, Vin___b and feed these amplified subsignals to the reconstruction stage 2.

The pre-amplifier Pre_Amp also features a detector ≥? that serves for amplitude measurements and is coupled to the amplifier. This detector ≥? is connected to a logical AND circuit & of the reconstruction stage 2 that can be controlled by a control unit Ctrl.

The detector ≥? controls the logical control circuit & in dependence on the signal amplitude of the subsignals Va, Vb in that it generates a switching signal Vsw. This switching signal is fed to the control unit CTRL that consequently controls the switches of the switched capacitors Ca, Cb. In this way, the signal paths a, b and the reconstruction paths ra, rb can be respectively selected in dependence on the signal amplitude. For example, if the switching signal Vsw is low, a signal path b is not active and does not contribute to the signal processing noise. A correspondingly high switching signal Vsw activates the signal path b.

In this example, the reconstruction stage 2 features an analog-digital converter ADC that is realized in accordance with the principle of a sigma-delta converter. On its input side, this analog-digital converter ADC features switched capacitors Ca, Cb that are designed for weighting and combining the two amplified subsignals Va, Vb.

The digital conversion takes place in accordance with the principle of a sigma-delta analog-digital converter. For this purpose, the analog-digital converter ADC features two reconstruction paths ra, rb that respectively contain one of the switched capacitors Ca, Cb. For example, the switched capacitors. Ca, Cb have different capacitance values to weight the amplified subsignals Va, Vb. However, the switched capacitors Ca, Cb can also be switched over with different speed or frequency.

The addition of the amplified and weighted subsignals. Va, Vb is also realized by the switched capacitors Ca, Cb in that the charges in the reconstruction paths are summed up by suitable switching sequences of the switched capacitors Ca, Cb. For example, an integrator Int is connected to the switched capacitors Ca, Cb for this purpose.

This example with a pre-amplifier Pre_Amp and an analog-digital converter ADC is particularly advantageous for audio applications. The input signals Vin are generated, for example, by a microphone.

In a not-shown example, the analog-digital converter ADC comprises more than two reconstruction paths ra, rb. In addition, the analog-digital converter ADC may feature feedback loops with several different reference signals (multilevel reference feedback structure). A contribution of the reference signals to the noise, therefore, can also be realized in dependence on the amplitude and reduced, for example, at low amplitudes. In this way, the noise characteristic of the analog-digital converter ADC can be kept particularly low.

Figure 4:
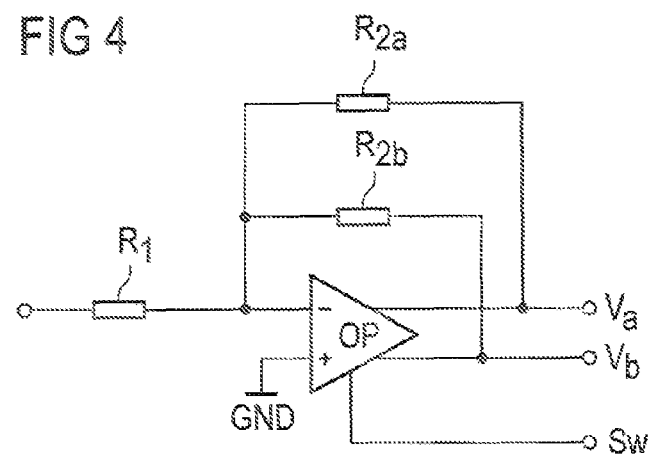
FIG. 4 shows an example of a signal processing stage with an operational amplifier.

FIG. 4 shows an example of the pre-amplifier Pre_Amp. The pre-amplifier Pre_Amp comprises an operational amplifier OP, wherein the input signal Vin is applied to an inverting input − of the operational amplifier OP by means of a first resistor. A non-inverting input + of the operational amplifier OP is connected to the ground potential GND.

The operational amplifier OP features at least two amplifier outputs, at which the two subsignals Vin_a, Vin_b or the amplified subsignals Va, Vb are respectively available. The respective amplified subsignals Va, Vb are fed back to the inverting input − of the operational amplifier by means of additional resistors R2a, R2b.

A switch output serves for the actuation of a switch SW for activating or deactivating signal paths in the above-described fashion. In this case, the detector ≥? may be realized separately or form part of the operational amplifier OP.

This special operational amplifier OP in the form of an inverter effectively features two feedback loops that respectively lead to the inverting input − of the operational amplifier OP via the resistor R2a and the resistor R2b. An overall current of the two feedback loops through the resistors R2a, R2b, therefore, is added up at the inverting input − such that a voltage, e.g. a microphone voltage Vm, is adjusted at said inverting input in accordance with $$V_m = V_a \frac{R_1}{R_{2a}} + V_b \frac{R_1}{R_{2b}}.$$

In other words, the weighting can be adjusted by the resistors R1, R2a, R2b.

Figure 5:
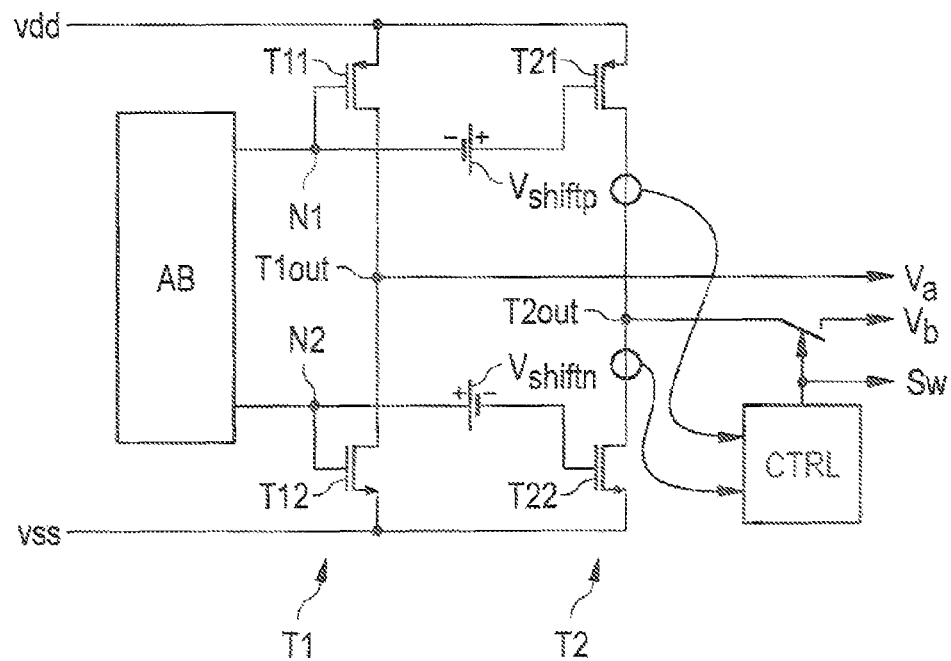
FIG. 5 shows an example of the operational amplifier.
Figure 6:
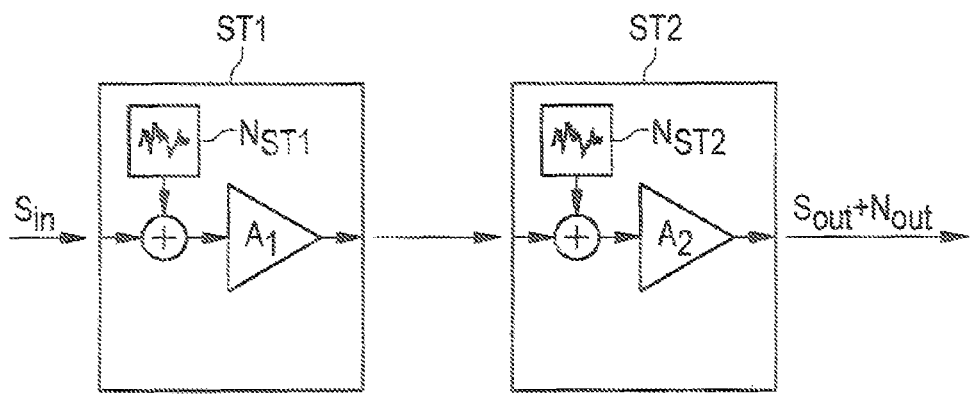
FIG. 6 shows an example of a signal processing arrangement according to the prior art.

FIG. 5 shows an example of the operational amplifier OP. In this example, the operational amplifier OP features on its input side a class AB driver stage AB connected to a first transistor stage T1. The first transistor stage T1 comprises two transistors T11, T12 connected by their load sides and supplied with supply voltages Vdd, Vss. Their respective control sides are coupled to the class AB driver stage AB by connection nodes N1, N2. One of the two subsignals Va, Vb is present at a transistor stage output T1out. In addition, a second transistor stage T2 is provided that features two transistors T21, T22 connected by their load sides and supplied with supply voltages Vdd, Vss. The respective control sides of the latter transistors are coupled to the connection nodes N1, N2 by voltage sources Vshiftp, Vshiftn. Another of the two subsignals Va, Vb is available at a transistor stage output T2out of the second transistor stage T2.

The subsignals V_a, V_b are initially generated from the input signal Vin by the class AB driver stage AB. Depending on the signal amplitude of the input signal Vin, the first transistor stage T1 is initially activated and the second transistor stage T2 is incrementally activated at a later time. The transition occurs, in particular, when the subsignals V_a, V_b at the output of the class AB driver stage AB come close to the saturation of the supply voltages Vdd, Vss.

In this example, the switch SW is connected to the transistor stage output T2out. It is controlled by the control unit CTRL that monitors, for example, a current at the transistor stage output T2out. If this current reaches a certain threshold value, the switch SW respectively switches the signal path b and the transistor stage output T2out into the active state.

The examples described with reference to FIGS. 1-5 merely show the division into two subsignals and the subsequent processing thereof. However, it is also possible to provide more than two signal paths and corresponding reconstruction paths when appropriate for the respective application. It is furthermore possible to provide a symmetric implementation that respectively provides a signal processing stage 1 and a reconstruction stage 2 for positive and for negative input signals Vin.

Measures for an offset compensation are provided in other not-shown examples. If the separated signal paths a, b or reconstruction paths ra, rb respectively have different offsets, this may lead to undesirable points of discontinuity in the transfer function, e.g., when switching the switch SW. This can be prevented with different arrangements.

The offset compensation may be achieved by autozero amplifiers or chopper amplifiers. A monoflop that can be repeatedly triggered (retriggerable monoflop) furthermore can prolong the activation of a signal path, wherein this can lead to fewer switching transitions, in particular, after a high signal amplitude occurs. It is furthermore possible to incorporate a hysteresis for switching threshold values into the signal paths. In this way, switching back and forth between the signal paths (on-off bouncing) is prevented, for example, if the signal amplitude remains close to a switching threshold value.

Another alternative or addition consists of respectively constructing one of the signal paths or reconstruction paths such that it is no longer necessary to switch on or off at certain amplitudes. It is possible, for example, to provide a path that has very little noise at amplitudes close to zero. In the example according to FIG. 3, it is possible to utilize a hybrid sigma-delta modulator. In such a structure, a switched capacitor Ca, Cb is replaced with current input in the form of a continuous time-signal input in one of the reconstruction paths ra, rb.

Other not-shown examples may be provided with further supplementary signal processing stages that are designed, for example, for particularly low noise. This also improves the power consumption for the signal processing. If the separator Sep is equipped with a feedback as shown in FIG. 4, an additional switch SW may also be provided in the feedback (source switching). In this way, a point of discontinuity in the transfer function can be prevented during switching of a signal path because the influence of this signal path is switched to the division in the separator Sep, as well as to the reconstruction in the reconstruction stage 2.

Although the apparatus and methods have been described in connection with specific forms thereof, it will be appreciated that a wide variety of equivalents may be substituted for the specified elements described herein without departing from the spirit and scope of this disclosure as described in the appended claims.

The invention claimed is:

1. A signal processing arrangement comprising:
    a signal processing stage that divides an input signal (Vin) applied to a signal input (In) of the signal processing stage into at least two subsignals (Vin_a, Vin_b) as a function of a signal amplitude (A) of the input signal (Vin), wherein the signal processing stage is a pre-amplifier (Pre_Amp) at which at least two amplifier outputs (Va, Vb) of which the at least two subsignals (Vin_a, Vin_b) are made available and is designed for parallel signal processing of the subsignals (Vin_a, Vin_b), and
    a reconstruction stage comprising an analog to digital converter (ADC) that weights and combines the at least two subsignals (Vin_a, Vin_b), is connected to the signal processing stage, and provides an output signal (Vout) which is a linear combination of the at least two processed subsignals (Vin_a, Vin_b) to reconstruct the input signal (Vin), wherein the output signal (Vout) is described by a linear function of the input signal (Vin).

2. The signal processing arrangement according to claim 1, wherein the signal processing stage comprises a separator (Sep) that comprises the signal input (In) and generates the at least two subsignals (Vin_a, Vin_b) in the form of non-linear subfunctions (fa, fb) of the signal amplitude (A) of the input signal (Vin).

3. The signal processing arrangement according to claim 2, wherein the signal processing stage comprises at least a first and a second signal path (a, b) that
    are respectively connected to the separator (Sep) to supply the at least two subsignals (Vin_a, Vin_b) and
    respectively have adjustable amplification factors (A1a, A1b).

4. The signal processing arrangement according to claim 1, wherein the reconstruction stage comprises at least a first and a second reconstruction path (ra, rb) that respectively have adjustable weighting factors (A2a, A2b) for weighting the at least two subsignals (Vin_a, Vin_b).

5. The signal processing arrangement according to claim 4, wherein
    the first and the second reconstruction paths (ra, rb) are connected to inputs of an adder (Add) to combine the at least two subsignals (Vin_a, Vin_b), and
    the adder (Add) provides the output signal (Vout) on an output side.

6. The signal processing arrangement according to claim 1, wherein the pre-amplifier (Pre_Amp) comprises an operational amplifier (OP), and
- the input signal (Vin) can be applied to an inverting input (−) of the operational amplifier (OP) by a first resistive element (R1), and
- at least two amplifier outputs (Va, Vb) of the operational amplifier (OP), at which the at least two subsignals (Vin_a, Vin_b) are available, are fed back to the inverting input (−) of the operational amplifier (OP) by additional resistive elements (R2a, R2b), and
- a non-inverting input (+) of the operational amplifier (OP) connects to the ground potential (GND).

7. The signal processing arrangement according to claim 6, wherein the operational amplifier comprising:
- a class AB driver stage (AB) on its input side;
- a first transistor stage (T1) with two transistors (T11, T12) connected by their load sides and supplied with supply voltages (vdd, vss),
- wherein the respective control sides of said transistors are coupled to the class AB driver stage (AB) by connection nodes (N1, N2) and one of the at least two subsignals (Vin_a, Vin_b) is available at the transistor stage output (T1out) of this first transistor stage; and
- a second transistor stage (T2) with two transistors (T21, T22) connected by their load sides and supplied with supply voltages (vdd, vss),
- wherein the respective control sides of said transistors are coupled to the connection nodes (N1, N2) by voltage sources (Vshiftp, Vshiftn) and another of the at least two subsignals (Vin_a, Vin_b) is available at the transistor stage output (T2out) of this second transistor stage.

8. The signal processing arrangement according to claim 1, wherein the signal processing stage or the reconstruction stage comprises a switch (SW1).

9. A signal processing method for electronic circuits comprising:
- dividing an input signal (Vin) into at least two subsignals (Vin_a, Vin_b) as a function of a signal amplitude (A) of the input signal (Vin) with a pre-amplifier (Pre_Amp) at which at least two amplifier outputs (Va, Vb) of which the at least two subsignals (Vin_a, Vin_b) are made available,
- parallel signal processing the at least two subsignals (Vin_a, Vin_b) in at least a first and a second signal path (a, b), and
- providing an output signal (Vout) by weighting and linearly combining the processed subsignals (Vin_a, Vin_b) with an analog to digital converter (ADC) that weights and combines the at least two subsignals (Vin_a, Vin_b), wherein the output signal (Vout) is described by a linear function of the input signal (Vin).

10. The signal processing method according to claim 9, wherein the weighting and combining of the processed subsignals (Vin_a, Vin_b) is carried out such that the output signal (Vout) is a linear function of the input signal (Vin).

11. The signal processing method according to claim 9, wherein division of the input signal (Vin) into the at least two subsignals (Vin_a, Vin_b) is carried out by non-linear subfunctions (fa, fb) of the signal amplitude (A) of the input signal (Vin).

12. The signal processing method according to claim 9, wherein the weighting is carried out by adjustable amplification factors (A1a, A1b) and adjustable weighting factors (A2a, A2b).

13. The signal processing method according to claim 9, wherein at least the first or the second signal path (a, b) is switched into the active or inactive state in dependence on the signal amplitude.

14. The signal processing method according to claim 10, wherein division of the input signal (Vin) into the at least two subsignals (Vin_a, Vin_b) is carried out by non-linear subfunctions (fa, fb) of the signal amplitude (A) of the input signal (Vin).

15. The signal processing method according to claim 10, wherein the weighting is carried out by adjustable amplification factors (A1a, A1b) and adjustable weighting factors (A2a, A2b).

16. The signal processing method according to claim 11, wherein the weighting is carried out by adjustable amplification factors (A1a, A1b) and adjustable weighting factors (A2a, A2b).

* * * * *